United States Patent [19]

Ribner

[11] Patent Number: 5,363,055
[45] Date of Patent: Nov. 8, 1994

[54] PHOTODIODE PREAMPLIFIER WITH PROGRAMMABLE GAIN AMPLIFICATION

[75] Inventor: David B. Ribner, Schenectady, N.Y.

[73] Assignee: General Electric Company, Schenectady, N.Y.

[21] Appl. No.: 31,447

[22] Filed: Mar. 15, 1993

[51] Int. Cl.$^5$ .......................... H03F 1/34; H03G 3/20
[52] U.S. Cl. .................................. 330/9; 330/51;
330/86; 330/282; 330/107; 330/294; 327/306;
327/337
[58] Field of Search ....................... 330/9, 51, 86, 107,
330/282, 294; 307/491; 328/127; 333/173

[56] References Cited

U.S. PATENT DOCUMENTS

| | | | |
|---|---|---|---|
| 4,529,965 | 7/1985 | Lee | 330/9 X |
| 4,626,808 | 12/1986 | Nosser | 333/173 |
| 4,644,304 | 2/1987 | Temes | 330/9 X |
| 4,815,118 | 3/1989 | Acharya et al. | 378/19 |

Primary Examiner—James B. Mullins
Attorney, Agent, or Firm—Marvin Snyder

[57] ABSTRACT

A combined programmable gain and integrating amplifier comprises an operational amplifier having an inverting input terminal coupled to a reference voltage. A plurality of capacitors are selectively connectable in parallel between the inverting input terminal and the amplifier output terminal. At least one terminal of each capacitor is connected to the inverting input terminal. A plurality of controllable switches are connected in series circuit between a corresponding one of the capacitors and the amplifier output terminal for coupling the capacitors in circuit between the inverting input terminal and the output terminal. In a first operational state, each of the switches connects the capacitors between the input and output terminals. In a second operational state, the switches connect selected ones of the capacitors the reference voltage. Another controllable switch is connected in circuit between the inverting input terminal and the output terminal for selectively short-circuiting the capacitors in order to reset the amplifier integration function.

16 Claims, 3 Drawing Sheets

PHOTODIODE PREAMPLIFIER WITH PROGRAMMABLE GAIN AMPLIFICATION

BACKGROUND OF THE INVENTION

The present invention relates to electric signal amplification circuits and, more particularly, to a programmable gain amplifier which may include an integrating preamplifier in a single circuit.

In some applications such as, for example, computerized tomography (CT) data acquisition systems (DAS), analog amplifiers are used to amplify small signals to within a predetermined range before coupling the signals to an analog-to-digital (A/D) converter. Amplifying the signals lowers the resolution needed by the A/D converter. U.S. Pat. No. 4,815,118, issued Mar. 21, 1989 and assigned to the assignee of the present invention, provides a discussion of programmable gain amplifiers and their use in CT data acquisition systems. As described therein, such programmable gain amplifiers have employed resistor switching or have used a plurality of amplifiers in parallel, each having a different gain and being individually selectable for a different gain setting. These prior art amplifiers have a settling time after a gain select, which is undesirable, and may also exhibit thermal and switching noise that can detrimentally affect circuit response.

SUMMARY OF THE INVENTION

The present invention provides an improved programmable gain amplifier with noise compensation suitable for amplifying relatively small signals of the type developed in CT scans. In an illustrative form, the input signal is developed from charge transfer from a photodiode in a CT detection circuit in which a full scale charge on the photodiode is about 200 picocoulombs. The amplifier circuit incorporates an operational amplifier having a plurality of capacitors connectable in parallel between an inverting input terminal and an output terminal. A plurality of controllable switches are connected in circuit with the capacitors and arranged to selectively connect the capacitors between the amplifier terminals or between one of the terminals and a reference potential. A reset switch connected between the input and output terminals is selectively actuatable for short-circuiting the capacitors and dissipating any residual charge prior to applying an input signal to the amplifier. The circuit may also include a noise compensating capacitor selectively connectable between the reference potential and one of the input and output terminals.

In operation, the circuit input is initially open and the plurality of capacitors are connected in parallel between the input and output terminals. The reset switch is actuated to short-circuit the capacitors and remove residual charge, and is thereafter opened. The noise compensation capacitor is coupled between the output terminal and the reference potential for a preselected charge interval and then switched to a connection between the input terminal and the reference potential. A high impedance signal, such as an accumulated photodiode charge, is applied to the input terminal and the charge is transferred to the parallel-connected capacitors. Finally, the plurality of controllable switches are selectively actuated to couple some of the parallel capacitors to the reference potential and transfer their charge to the others of the parallel capacitors for effectively controlling the gain of the amplifier.

BRIEF DESCRIPTION OF THE DRAWINGS

For a better understanding of the present invention, reference may be had to the following detailed description taken in conjunction with the accompanying drawings in which.

DETAILED DESCRIPTION

Figure 1B:
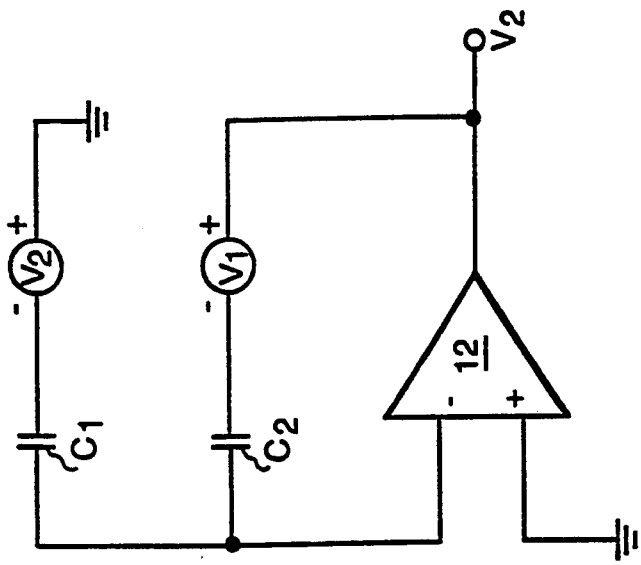
FIGS. 1A and 1B are simplified schematic diagrams of a programmable gain amplifier in a charge storage and amplifying mode, respectively.
Figure 1A:
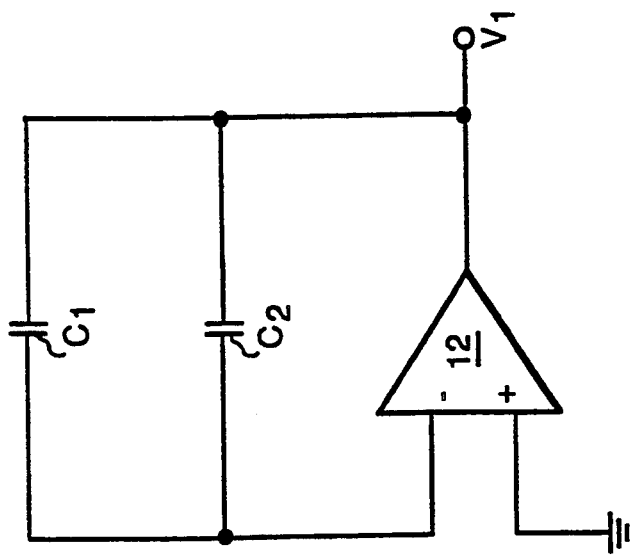

FIGS. 1A and 1B, illustrate a programmable gain amplifier circuit 10 comprising an operational amplifier 12 having a pair of capacitors $C_1$ and $C_2$ selectively connectable between an inverting input terminal and an output terminal of amplifier 12. In the circuit of FIG. 1A, the output signal is assumed to be an arbitrary voltage $V_1$ so that the voltage across capacitors $C_1$, $C_2$ is equal to $V_1$. In the circuit of FIG. 1B, capacitor $C_1$ has been reconnected between the amplifier inverting input terminal and a reference potential, illustrated as a ground potential. Assuming an arbitrary output voltage $V_2$ in FIG. 1B, it is apparent that the output voltage value is:

$$V_2 = V_1 \left(1 + \frac{C_1}{C_2}\right).$$

If the number of capacitors connectable in the parallel arrangement is increased, it is possible to obtain various selected voltage gains. More particularly, by using an array of $2^M$ equal-valued capacitors, one can obtain amplification by binary weighted multiples. For example, if an arbitrary number n of the $2^M$ capacitors are connected to reference ground and the remaining $2^M$-n capacitors are connected in feedback between the inverting input and output terminals, the amplifier gain G can be expressed as:

$$G = \frac{V_2}{V_1} = 1 + \left(\frac{n}{2^M - n}\right); 0 \leq n < 2^M.$$

If the value of n is chosen to be $n = 2^M - 2^i$, where i is an integer from 0 to M, the gain can be expressed as:

$$G = \frac{V_2}{V_1} = 1 + \left(\frac{2^M - 2^i}{2^i}\right) = 2^{M-i}; 0 \leq i \leq M.$$

Accordingly, all the binary weighted gains from 1 to $2^M$ can be generated from the array of $2^M$ capacitors by selectively connecting an appropriate number of capacitors between the amplifier terminals and between the inverting input terminal and reference ground.

Figure 2:
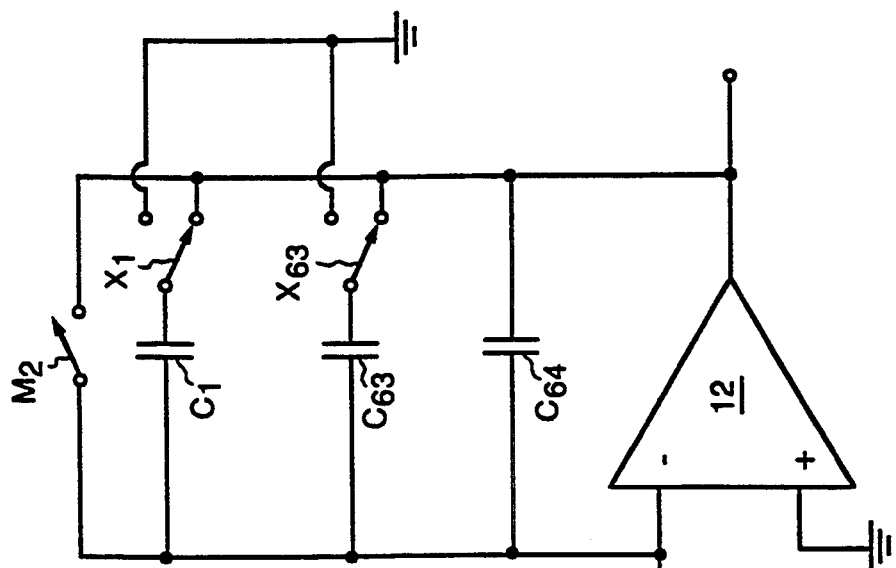
FIG. 2 is a simplified schematic diagram of a photodiode integrator and programmable gain amplifier in accordance with one form of the invention.

FIG. 2 illustrates a simplified implementation of the present invention for an integrating amplifier with programmable gain control. Amplifier 12 is coupled in circuit with a plurality of equal valued capacitors $C_1$, $C_2$, ... $C_{63}$, $C_{64}$ connectable in parallel between its inverting input terminal and its output terminal The number of capacitors, i.e., $2^M$ is selected to be 64 so that gains of 1, 2, 4, 8, 16, 32 and 64 can be implemented. All but at least one of the capacitors are connected in series with a respective one of a plurality of single-pole double throw (SPDT) switches $X_1$, $X_2$ ... $X_{63}$. Switches $X_1$-$X_{63}$ are arranged to selectively couple each associated capacitor either between the inverting and output terminals or between the inverting terminal and reference ground. A reset switch $M_2$ is connected between the amplifier input and output terminals to enable dissipation of any accumulated charge on capacitors $C_1$-$C_{64}$ prior to applying an input signal to the amplifier. There is also an input isolation switch $M_1$ for decoupling the input signal source, illustrated as a photodiode 14 in series with a bias source 15, during at least the reset time (switch $M_2$ closed) of capacitors $C_1$-$C_{64}$.

Switch $M_1$ is shown as an insulated gate field effect transistor (IGFET) and switches $M_2$ and $X_1$-$X_{63}$ may be implemented in the same form. Switches $X_1$-$X_{63}$ may be tri-state devices, or merely a pair of IGFETs, or two pair of CMOS (complementary metal-oxide-semiconductor) field-effect transistors having one terminal connected to the associated capacitor and another terminal connected to one of the amplifier output terminal or reference ground. Since the reference potential for the amplifier is reference ground, the non-inverting amplifier input terminal is also connected to reference ground.

Operation of the circuit of FIG. 2 can be described in terms of phases or time sequences. In a first phase, switch $M_1$ is open, switch $M_2$ is closed and switches $X_1$-$X_{63}$ are set such that all capacitors $C_1$-$C_{64}$ are in parallel between the inverting input terminal and output terminal of amplifier 12. Capacitors $C_1$-$C_{64}$ are all discharged and the amplifier/integrator output signal is reset to zero. During a next subsequent or second phase, switch $M_2$ is opened and switch $M_1$ closed. Any charge on photodiode 14 is integrated onto the parallel connected array of capacitors $C_1$-$C_{64}$, i.e., the charge on the photodiode is transferred to the capacitors. During a next or third phase, switch M1 is opened and selected ones of switches $X_1$-$X_{63}$ are actuated to connect $n = 2^M - 2^i$ of capacitors $C_1$-$C_{64}$ to reference ground while $2^i$ capacitors remain connected in feedback. The programmed gain in this third phase is $2^{M-i}$ as described above. The programmed gain may be set by a microcomputer 16, or by a controller implemented in discrete or integrated logic, which provides the actuating signals to switches $M_1$, $M_2$ and $X_1$-$X_{63}$. As mentioned above, the switches are typically FET devices and in a preferred monolithic integrated circuit design are implemented as MOSFET devices. An important property of this circuit is that the open-circuit state of switch $M_1$ prevents discharge of capacitors $C_1$-$C_{64}$ so that various ones of the capacitors can be switched back and forth from one setting to another for gain select without degrading or changing the amount of stored charge, a feature particularly advantageous in an autoranging application. This feature also facilitates implementation of cancellation of amplifier and reset kTC noise.

Given that the circuit of FIG. 2 is to be implemented such that gains are in binary weighted increments, it will be apparent that the feedback capacitors may be implemented in binary weighted values and reduce the number of capacitors and switches from that of the illustration. For example, a first capacitor could have one unit of capacitance, a second could have two units of capacitance, a third could have four units, a fourth could have eight units, a fifth could have sixteen units, a sixth could have thirty-two units and a seventh unswitched capacitor of one unit, with a unit representing a selected value such as 4 pf. This implementation would allow selection of any binary weighted gain from 1 to 64 using only six switches. The seventh capacitor of single unit size is not switched and is permanently connected between the output and input of the operational amplifier.

The arrangement of FIG. 2 also implements an auto-zeroing function. During phase one, the capacitors are connected between the inverting input terminal and the output terminal, which forces the amplifier to reset to the voltage at the inverting input terminal, a voltage which is nominally zero. However, there is normally some offset value which must be applied to the inverting input terminal (the "input referred offset") in order to produce zero volts output. With the capacitors connected in feedback, the capacitors are charged from the amplifier output to the few millivolts necessary to produce an actual zero volts output signal. This stored charge thereafter compensates for any voltage offset at the inverting input terminal necessary to produce a zero volts signal at the amplifier output. An additional switch $X_{64}$ (not shown in FIG. 2) connected to capacitor $C_{64}$ is required to implement this auto-zeroing operation.

Figure 3:
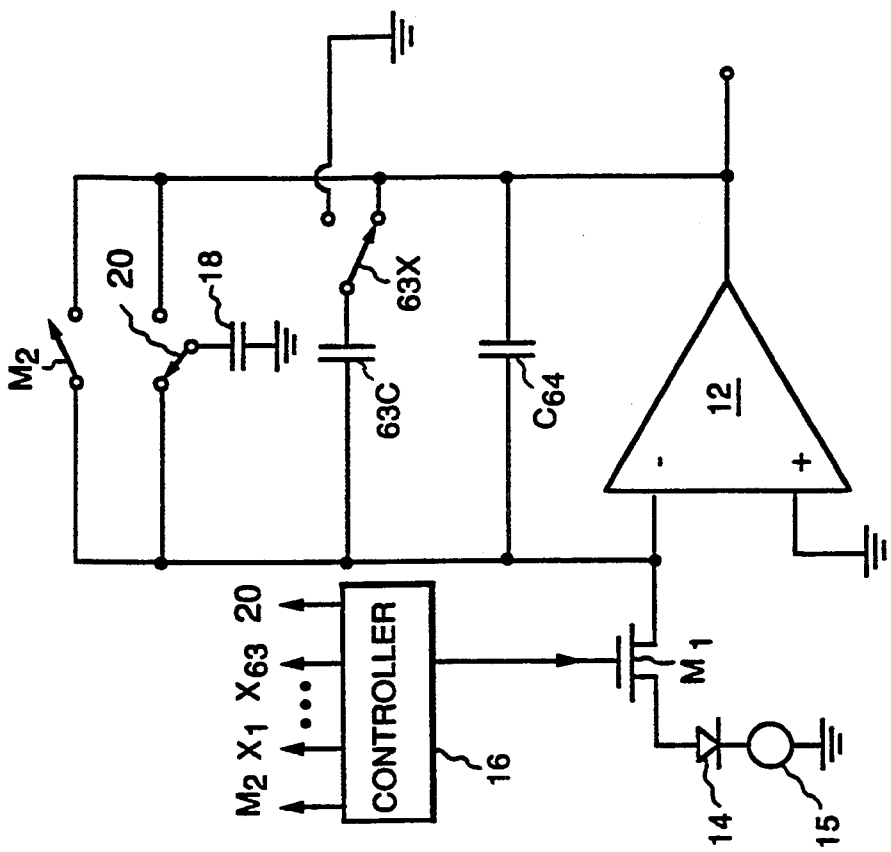
FIG. 3 is a simplified schematic diagram of another form of the integrator and amplifier of FIG. 2.

FIG. 3 illustrates a further embodiment of the circuit of FIG. 2 which incorporates a capacitor 18 and switch 20 for cancelling operational amplifier noise and kTC noise, the latter noise being a well known noise generated by switching transients in capacitive circuits and wherein k is Boltzman's constant, T is temperature and C is capacitance. (For simplicity of explanation, capacitors $C_1$-$C_{63}$ and switches $X_1$-$X_{63}$ are lumped together as 63C and 63X in FIG. 3; however, separate elements are still used in the actual circuit.) After resetting feedback capacitors $C_1$-$C_{64}$ in the first phase, a second phase or time sequence is introduced in which capacitor 18 is coupled between the amplifier output and reference ground. In this connection, the reset kTC noise is amplified by a gain of $2^M$ by switching ($2^M - 1$) capacitors to ground and is sampled by capacitor 18. During a third phase, while the input signal is being applied to the amplifier, capacitor 18 is concurrently connected between the amplifier inverting input terminal and ground so that the sampled noise (and any offset voltage) is now applied to the input terminal. The sampled noise corresponds to any kTC noise stored on the parallel-connected capacitors $C_1$-$C_{64}$ and therefore exactly cancels the stored noise. The fourth phase, in which parallel capacitors $C_1$-$C_{64}$ are selectively switched in circuit to set a particular gain, proceeds in the manner described above.

Figure 4:
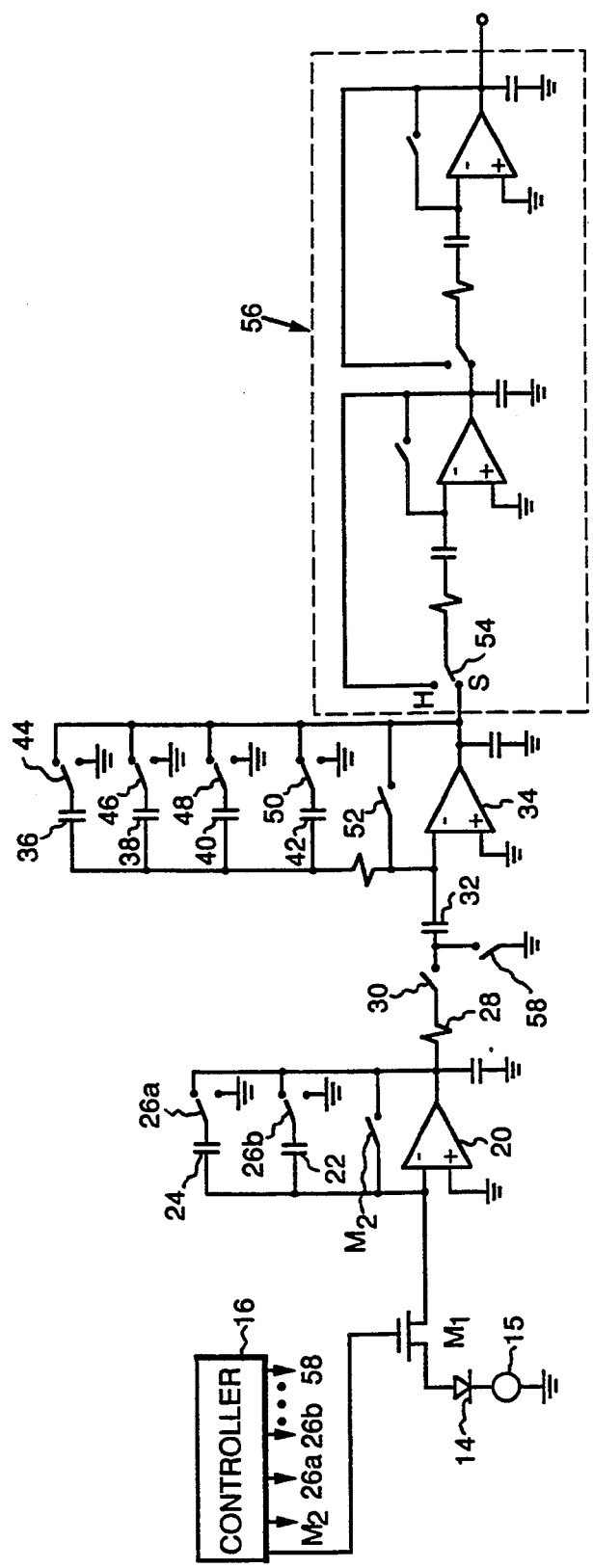
FIG. 4 is a schematic diagram of one implementation of the programmable gain amplifier/integrator of the invention.

FIG. 4 illustrates a data acquisition circuit incorporating the teaching of the present invention and shows a further modification in which the functions of integration and programmable gain are separated into different elements. This implementation also has the advantage of reducing the number of capacitors required to attain binary gains from 1 to 64 by using two amplifier stages. Operation of the circuit of FIG. 4 will be described in terms of four phases designated $\phi 1$, $\phi 2$, $\phi 3$ and $\phi 4$, and reference is concurrently made to FIG. 5 for the timing of each phase.

As shown in FIG. 4, a first stage preamplifier 20 incorporates two feedback capacitors 22 and 24, each of which is connected in series with a respective one of switches 26a and 26b to allow the capacitors to be switched in and out of the circuits to change the gain. The reset switch $M_2$ operates in the manner described above with regard to FIG. 3. The output terminal of preamplifier 20 is coupled through a resistor 28, switch 30 and capacitor 32 to an inverting input terminal of a programmable gain amplifier 34. Amplifier 34 incorporates a plurality of parallel connectable capacitors 36, 38, 40 and 42 with each of these capacitors being connected in series with a respective one of a corresponding plurality of SPDT switches 44, 46, 48 and 50. Another reset switch 52 is connected in parallel with capacitors 36, 38, 40 and 42. The output terminal of amplifier 34 is connected through another switch 54 to a sample and hold circuit 56 of a generally conventional type. Additionally, a switch 58 connects an input side of coupling capacitor 32 to ground.

The values of capacitors 22 and 24 are selected to provide a gain of 1 and 8 and the values of capacitors 36, 38, 40 and 42 are selected to provide gains of 1, 2, 4, 6 and 8 as previously described with regard to FIG. 2 by selecting the values of the capacitors in binary weighted increments. The two amplifier stages 20 and 34 in cascade thus provide gain ranges of all the binary values ($2^M$) from 1 to 64.

Figure 5:
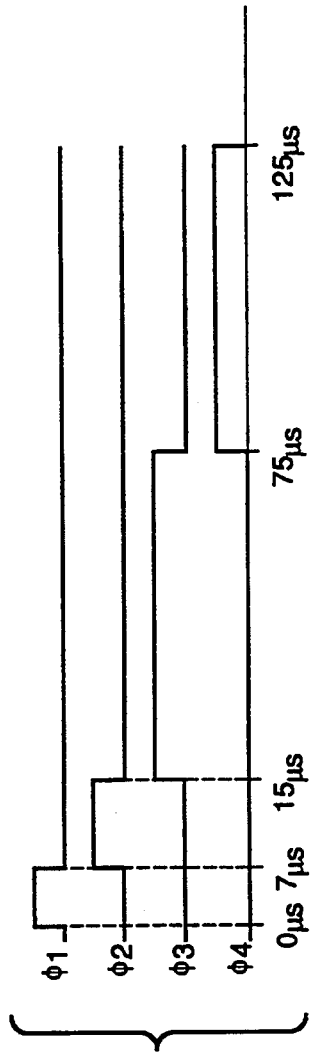
FIG. 5 is a timing diagram for the system of FIG. 4.

In operation, switch $M_1$ is in an open-circuit condition during time phases $\phi 1$, $\phi 2$, and $\phi 4$, closing only during phase $\phi 3$, so that a signal is applied to the DAS circuit only during phase $\phi 3$. In phase $\phi 1$, switches $M_2$, 52 and 58 are closed, switches 26a and 26b are conditioned to connect capacitors 22 and 24 to ground, switches 44, 46, 48 and 50 are conditioned to connect capacitors 36, 38, 40 and 42, respectively, to ground, and switch 54 is conditioned to disconnect sample and hold circuit 56 from amplifier 34. During phase $\phi 1$, capacitors 22, 24, 36, 38, 40 and 42 are discharged or reset to initializing conditions. As shown in FIG. 5, phase $\phi 1$ may be only seven microseconds (7µs) in duration. It will be noted that this initializing state implements an auto-zero function and differs from that described in conjunction with FIG. 2 since the additional SPDT switch is used and binary capacitor values are used.

In a second phase ($\phi 2$) beginning at 7µs and continuing to 15µs, switches $M_2$ and 58 are open and switch 30 is closed. Also during phase $\phi 2$, switch 26a remains connected to ground whereas switch 26b switches to the output of operational amplifier 20. This connection amplifies the reset kTC noise sampled on capacitors 22 and 24 at the end of phase $\phi 1$ in the manner described in reference to FIG. 3. For the capacitor values shown here, a gain of 8 is introduced, i.e., $$\left(1 + \frac{47.7}{6.8}\right).$$

At the end of phase $\phi 2$, reset switch 52 is opened, thereby sampling the amplified kTC noise on capacitor 32. This facilitates cancellation of the kTC noise when preamplifier 20 is in the gain of 8 mode but by correlated-double sampling. In the unity gain mode the noise is not cancelled; however, in x-ray applications, higher noise is allowable on the lower gain ranges due to the higher quantum noise associated with large input signals. To avoid this higher noise, the method of FIG. 3 can be used with capacitor 32 coupled to amplifier 34 with an SPDT (not shown) during phase $\phi 3$ and grounded during the other phase. During phase $\phi 3$, switches 26b and 26a, and 44, 46, 48 and 50 are conditioned to connect capacitors 22, 24 and 36, 38, 40 and 42 in feedback between the respective amplifier input and output terminals, thus setting an initial gain of one for the circuit. During phase $\phi 3$, switch $M_1$ closes so that the charge on photodiode 14 is transferred to parallel connected capacitors 22,24 of preamplifier 20 and to capacitors 36, 38, 40 and 42 of amplifier 34. Preamplifier 20 acts as a voltage source for amplifier 34 with capacitor 32 serving to convert the voltage to a constant charge. During the last phase $\phi 4$, switch $M_1$ is open as is switch 30. Switch 54 is closed to connect circuit 56 to amplifier 34 for sampling the developed output voltage. At this time, switches 44, 46, 48 and 50 are conditioned to set a selected gain for amplifier 34 as previously described with regard to FIG. 2. It will also be noted that the switches are all implemented in a break-before-make arrangement.

The circuit of FIG. 4, in addition to providing an integrating function, also employs amplifier 34 as a programmable gain amplifier having several advantages over programmable amplifiers of the resistive type. For example, capacitors occupy a smaller area in a monolithic integrated circuit and it is easier to develop matched capacitors than resistors since capacitance is directly related to surface area and capacitors require less power than resistors since they operate on sampled charge rather than continuous current.

While the circuits described herein have been shown in single ended form, it will be apparent that identical switching circuits can be coupled to differential output amplifiers to create a fully differential programmable gain arrangement. For example, in a differential implementation, a set of capacitors and switches as described in conjunction with FIG. 2 would also be connected from the non-inverting input terminal to the inverting output terminal of the amplifier.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A combined programmable gain and integrating amplifier comprising:

an operational amplifier having an inverting input terminal, a non-inverting input terminal and an output terminal, said non-inverting input terminal being coupled to a reference voltage;

a plurality of capacitors connectable in parallel between said inverting input terminal and said output terminal of said amplifier, at least one terminal of each of said capacitors being connected to said inverting input terminal;

a plurality of controllable switching means, each of said switching means being connected in series circuit between another terminal of a corresponding one of said capacitors and said output terminal for coupling said capacitors in circuit between said inverting input terminal and said output terminal in and for connecting said another terminal of selected ones of said capacitors to the reference voltage; and means for controlling said switching means to connect each of said capacitors in circuit between said inverting input terminal and said output terminal in a first time phase of operation and to connect said another terminal of said selected ones of said capacitors to the reference voltage in a second time phase of operation.

2. The integrating amplifier of claim 1 and including a first additional controllable switching means connected in circuit between said inverting input terminal and said output terminal, said first additional switching means being selectively operable to short-circuit said capacitors for resetting said integrating amplifier.

3. A combined programmable gain and integrating amplifier comprising:

an operational amplifier having an inverting input terminal, a non-inverting input terminal and an output terminal, said non-inverting input terminal being coupled to a reference voltage;

a plurality of capacitors connectable in parallel between said inverting input terminal and said output terminal of said amplifier, at least one terminal of each of said capacitors being connected to said inverting input terminal;

a plurality of controllable switching means, each of said switching means being connected in series circuit between another terminal of a corresponding one of said capacitors and said output terminal for coupling said capacitors in circuit between said inverting input terminal and said output terminal in a first state of operation, each of said switching means having a second state of operation for connecting said another terminal of selected ones of said capacitors to the reference voltage;

a first additional controllable switching means connected in circuit between said inverting input terminal and said output terminal, said fist additional switching means being selectively operable to short-circuit said capacitors for resetting said integrating amplifier;

a first additional capacitor selectively connectable between said reference voltage and one of said inverting input terminal and said output terminal; and a second additional controllable switching means coupled in circuit with said first additional capacitor for selectively connecting said first additional capacitor between said output terminal and said reference voltage for sampling noise at said output terminal and for subsequently connecting said first additional capacitor between said inverting input terminal and said reference voltage for cancelling noise on said plurality of capacitors.

4. The integrating amplifier of claim 3 and including:

a signal source connectable to said inverting input terminal; and a third additional controllable switching means coupled between said signal source and said inverting input terminal for selectively coupling signals from said source to said amplifier.

5. The integrating amplifier of claim 4 and including:

means for actuating each of said plurality of controllable switching means to a first state for coupling each of said plurality of capacitors in parallel between said inverting input terminal and said output terminal and for concurrently actuating said first additional controllable switching means to a first state for establishing a short-circuit condition across said plurality of capacitors, said means for actuating being operable to actuate said first additional controllable switching means to a second state immediately subsequent to said first state in which said first additional controllable switching means is open-circuited and being concurrently operable to actuate said third additional controllable switching means to couple said signal source to said inverting input terminal, said means for actuating being operable to actuate said third additional controllable switching means to a third state immediately subsequent to said second state in which said third additional controllable switching means is open-circuited and selected ones of said plurality of switching means are concurrently actuated to couple selected respective ones of said plurality of capacitors to said reference voltage for establishing a selected gain for said amplifier.

6. A method for establishing a controllable gain in an operational amplifier, said amplifier including a plurality of capacitors connectable in parallel, circuit arrangement between an amplifier input and output terminals, said amplifier being referenced to a preselected reference voltage, said method comprising the steps of:

connecting the plurality of capacitors in parallel circuit arrangement between the amplifier input and output terminals;

providing an electric charge to the amplifier input terminal for transfer of the charge to the plurality of capacitors in a first state of operation; and selecting a gain for the amplifier by disconnecting selected ones of the plurality of capacitors from the amplifier output terminal and connecting the selected capacitors to the reference voltage so as to transfer the said plurality of capacitors in a second state of operation.

7. The method of claim 6 and including, after the step of connecting the plurality of capacitors in parallel circuit arrangement between the amplifier input terminal and output terminal, and prior to the step of providing an electric charge to the amplifier input terminal, the step of:

short-circuiting the amplifier input terminal to the amplifier output terminal so as to implement an auto-zero compensation function.

8. The method of claim 6 and including a second amplifier connected in cascade arrangement with said operational amplifier, the second amplifier including a second plurality of capacitors selectably connectable between an input terminal of said second amplifier, an output terminal of said second amplifier, and said reference voltage, wherein the recited steps of connecting and selecting include connecting and selecting capacitors of said second plurality in operative association with each of the amplifiers concurrently.

9. The method of claim 6 including the further step, subsequent to the connecting step and prior to the providing step, of short-circuiting each of the plurality of capacitors and dissipating any charge collected thereon.

10. The method of claim 9 including the further step, concurrently with the providing step, of switching an additional capacitor into connection with the amplifier output terminal for a preselected time interval and thereafter switching the additional capacitor into connection with the amplifier input terminal.

11. A programmable gain amplifier circuit comprising:
- a first amplifier stage including an operational amplifier having an inverting input terminal and an output terminal, at least a first and a second capacitor with at least one of said capacitors being selectively connectable between said input terminal and said output terminal, and switch means connected in circuit with at least one of said capacitors for selectively connecting said at least one capacitor between said input and output terminal or between said input terminal and a reference voltage;
- a second amplifier stage including an operational amplifier having an inverting input terminal and an output terminal, said input terminal of said second stage amplifier being coupled to said output terminal of said first stage amplifier, at least a pair of additional capacitors with at least one of said pair of additional capacitors being selectively connectable between said input and output terminals of said second stage amplifier, and additional switch means connected in circuit with said at least one of said pair of additional capacitors for selectively connecting said at least one capacitor between said input and output terminals of said second stage amplifier or between said input terminal and the reference voltage; and
- means for selectively actuating said switch means and said additional switch means for establishing a selected overall gain for said first and second amplifier stages.

12. The programmable gain amplifier circuit of claim 11 and further comprising:
- a first and a second reset switch means connected respectively in circuit with said first and second amplifier stages for selectively short-circuiting each of said at least one capacitors so as to dissipate residual charges collected thereon.

13. The programable gain amplifier circuit of claim 12 and further including controllable switching means for coupling said first amplifier stage to a signal source.

14. The programable gain amplifier circuit of claim 13 wherein said means for selectively actuating said switch means is operative to open-circuit said controllable switching means prior to actuating said first and second reset switch means.

15. The programable gain amplifier circuit of claim 14 and including additional controllable switching means for coupling said output terminal of said first amplifier stage to said input terminal of said second amplifier stage, said additional controllable switching means being open-circuited during at least a time when an output signal at said output terminal of said second amplifier stage is sampled.

16. The programable gain amplifier circuit of claim 15 and including a coupling capacitor connected between said additional controllable switching means and said input terminal of said second amplifier stage, and a third reset switch means connected to a junction intermediate said coupling capacitor and said additional controllable switching means for selectively connecting said coupling capacitor to said reference voltage for discharging accumulated charge thereon.

* * * * *